United States Patent
Hanada et al.

(10) Patent No.: US 12,191,397 B2
(45) Date of Patent: Jan. 7, 2025

(54) SEMICONDUCTOR DEVICE

(71) Applicant: Japan Display Inc., Tokyo (JP)

(72) Inventors: Akihiro Hanada, Tokyo (JP); Hajime Watakabe, Tokyo (JP); Takuo Kaitoh, Tokyo (JP); Ryo Onodera, Tokyo (JP)

(73) Assignee: Japan Display Inc., Tokyo (JP)

( * ) Notice: Subject to any disclaimer, the term of this patent is extended or adjusted under 35 U.S.C. 154(b) by 312 days.

(21) Appl. No.: 17/522,258

(22) Filed: Nov. 9, 2021

(65) Prior Publication Data

US 2022/0173247 A1    Jun. 2, 2022

(30) Foreign Application Priority Data

Dec. 1, 2020  (JP) .................................. 2020-199913

(51) Int. Cl.
*H01L 29/786* (2006.01)

(52) U.S. Cl.
CPC .... *H01L 29/7869* (2013.01); *H01L 29/78618* (2013.01)

(58) Field of Classification Search
CPC ............... H01L 29/7869; H01L 29/786; H01L 29/78618; H01L 29/41733; H01L 29/417; G09G 3/3233; G09G 3/2141; G09G 3/3258; H10K 59/1213; H10K 59/121; H10K 59/123
See application file for complete search history.

(56) References Cited

U.S. PATENT DOCUMENTS

| | | | |
|---|---|---|---|
| 7,202,501 B2* | 4/2007 | Kim | H01L 29/66757 438/149 |
| 8,253,141 B2* | 8/2012 | Park | H01L 27/1277 257/66 |
| 9,130,047 B2* | 9/2015 | Sakakura | H01L 29/66742 |
| 2005/0110022 A1* | 5/2005 | Kim | H01L 29/78618 257/E29.117 |
| 2010/0006855 A1* | 1/2010 | Park | H01L 27/1277 257/66 |
| 2012/0112184 A1 | 5/2012 | Yamazaki et al. | |
| 2013/0069054 A1 | 3/2013 | Isobe et al. | |

(Continued)

FOREIGN PATENT DOCUMENTS

| | | |
|---|---|---|
| JP | 2005159305 A | 6/2005 |
| JP | 2015046580 A | 3/2015 |
| JP | 2018137422 A | 8/2018 |

OTHER PUBLICATIONS

Office Action issued on Jul. 30, 2024, in corresponding Japanese Application No. 2020-199913, 9 pages.

(Continued)

*Primary Examiner* — Nikolay K Yushin
(74) *Attorney, Agent, or Firm* — Maier & Maier, PLLC

(57) ABSTRACT

A semiconductor device includes a thin-film transistor. The thin-film transistor comprises an oxide semiconductor layer, a gate insulating layer, a gate electrode overlapped on the oxide semiconductor layer through the gate insulating layer, a source electrode in contact with the oxide semiconductor layer, a drain electrode in contact with the oxide semiconductor layer and a first metal layer in contact with the oxide semiconductor layer and disposed between the source electrode and the drain electrode at a distance from the source electrode and the drain electrode.

12 Claims, 12 Drawing Sheets

(56) References Cited

U.S. PATENT DOCUMENTS

2015/0034945 A1\* 2/2015 Sakakura ............ H01L 29/7831
　　　　　　　　　　　　　　　　　　　　257/43
2015/0102336 A1\* 4/2015 Kang ................... H10K 59/123
　　　　　　　　　　　　　　　　　　　　257/43
2019/0393353 A1　12/2019 Samsung

OTHER PUBLICATIONS

English machine translation of Office Action dated Oct. 31, 2024, issued in CN Application No. 202111367388.5, 8 pages.

\* cited by examiner

SEMICONDUCTOR DEVICE

CROSS REFERENCE TO RELATED APPLICATIONS

This application is based on and claims the benefit of priority from the prior Japanese Patent Application No. 2020-199913, filed on Dec. 1, 2020, the entire contents of which are incorporated herein by reference.

FIELD

One embodiment of the present invention relates to a semiconductor device including a thin-film transistor in each pixel. In particular, one embodiment of the present invention relates to a display device including a thin-film transistor using an oxide semiconductor.

BACKGROUND

Recently, an oxide semiconductor has attracted attention as a semiconductor constituting a channel layer of a thin-film transistor used in an organic light-emitting diode display device (OLED display device). The thin-film transistor using an oxide semiconductor has low leakage current in the off-state and can be driven at low frequencies. Therefore, the thin-film transistor using the oxide semiconductor can realize a display device with low power consumption.

Generally, thin-film transistors have the problem that electrical characteristics are degraded by hot carriers generated near a boundary between a channel region and a drain region. Specifically, it is known that thresholds of Vg-Id characteristics are shifted by hot carriers. This problem is not an exception even in thin-film transistors using oxide semiconductors, in order to improve the reliability, it is desirable to take hot carrier countermeasures. For example, Patent Literature 1 discloses a technique of arranging a buffer region for relieving electric field concentration between a channel region and a drain region as the hot carrier countermeasure.

SUMMARY

A semiconductor device in one embodiment of the present invention has a thin-film transistor in each pixel. The thin-film transistor comprises an oxide semiconductor layer, a gate insulating layer, a gate electrode overlapped on the oxide semiconductor layer through the gate insulating layer, a source electrode in contact with the oxide semiconductor layer, a drain electrode in contact with the oxide semiconductor layer and a first metal layer in contact with the oxide semiconductor layer and disposed between the source electrode and the drain electrode at a distance from the source electrode and the drain electrode.

DESCRIPTION OF EMBODIMENTS

Figure 1:
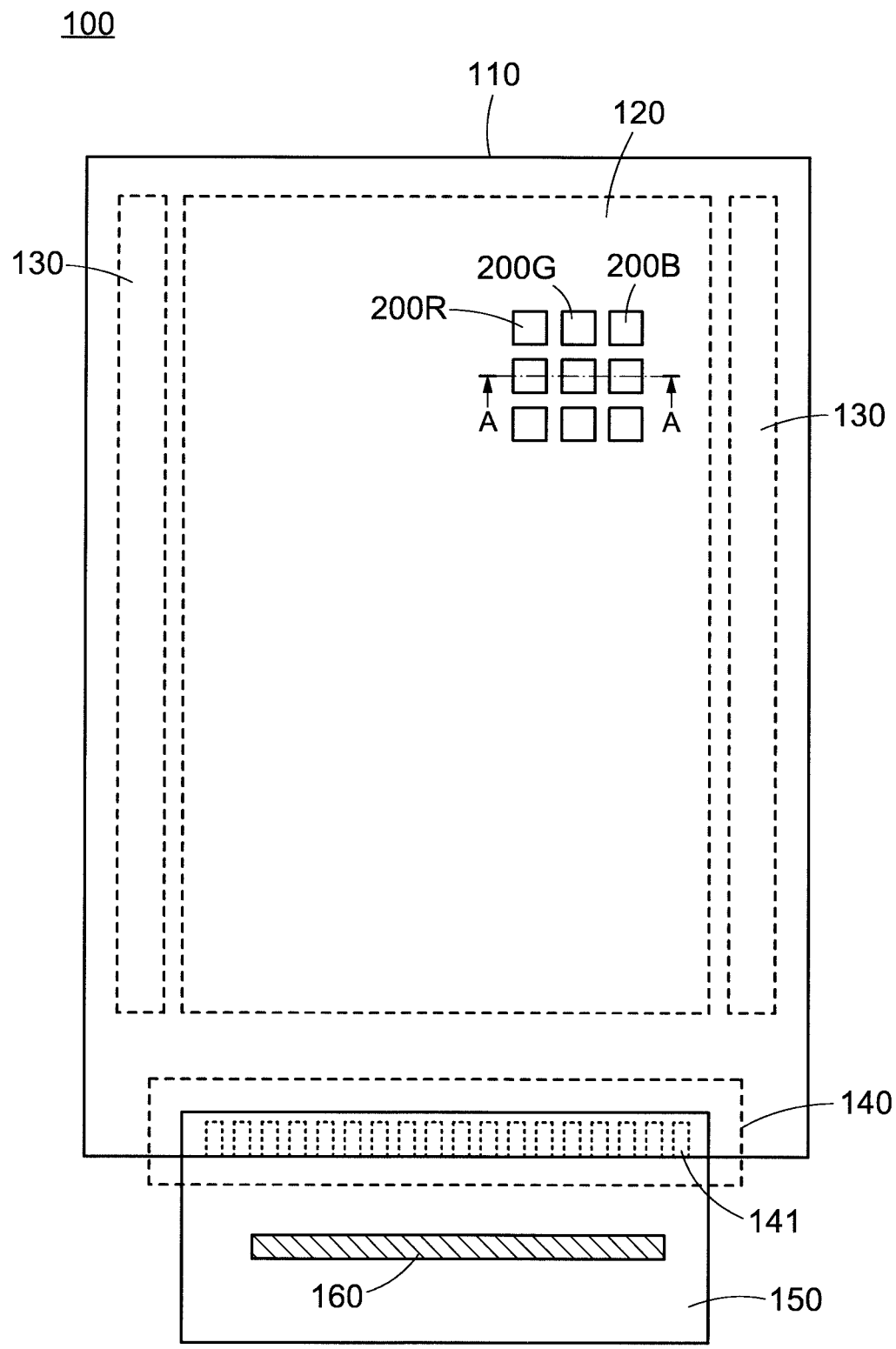
FIG. 1 is a plan view of a configuration of a display device according to a first embodiment of the present invention.

The prior art mentioned above determines the length (L) of a buffer region by controlling the amount of retraction when etching a drain electrode isotropically. Therefore, when forming a plurality of thin-film transistors on a substrate, there is a case where variations occur in the distribution of the etching amount in the substrate plane. In this case, it is impossible to form a buffer region having a uniform length for the plurality of thin-film transistors, which may reduce a reliability of the display device.

One of the problems of the present invention is to improve the reliability of the semiconductor device including a thin-film transistor using an oxide semiconductor (in particular, a display device).

Embodiments of the present invention will be described below with reference to the drawings and the like. However, the present invention can be implemented in various modes without departing from the gist thereof. The present invention is not to be construed as being limited to the description of the following exemplary embodiments. For the sake of clarity of description, the drawings may be schematically represented with respect to widths, thicknesses, shapes, and the like of the respective portions in comparison with actual embodiments. The drawings, however, are to be regarded as illustrative and not restrictive of the interpretation of the invention.

In the description of the embodiment of the present invention, the direction from the substrate toward a light emitting element is defined as "above", and the opposite direction is defined as "below". However, the expression "above" or "below" merely describes the upper limit relationship of each element. For example, the expression that the light emitting element is disposed on the substrate also includes the case where other members are interposed between the substrate and the light emitting element. Furthermore, the expression "above" or "below" includes not only the case in which the elements overlap in a plan view, but also the case in which the elements do not overlap.

In the description of the embodiment of the present invention, components having the same functions as those of the elements already described are denoted by the same reference numerals or the same reference numerals, and the description thereof is omitted.

In describing embodiments of the present invention, a plurality of elements formed by applying a processing such as etching to one film may be described as elements having different functions or different roles. These elements are composed of the same layer structure and the same material. Therefore, the plurality of elements formed from one film may be referred to as elements provided in the "same layer".

In the description of embodiments of the invention, the expressions "a includes A, B or C," "a includes any of A, B and C," "a includes one selected from a group consisting of A, B and C," do not exclude the case where a includes multiple combinations of A to C unless otherwise indicated. Furthermore, these expressions do not exclude the case where a includes other elements.

In the description of the embodiments of the present invention, a "display device" refers to a device for displaying an image. That is, the "display device" includes not only a display panel or a display module, but also a device in which other optical members (e.g., polarizing members, touch panels, etc.) are attached to the display panel or the display module.

First Embodiment

[Configuration of Display Device 100]

FIG. 1 is a plan view showing a configuration of a display device 100 according to a first embodiment of the present invention. The display device 100 includes a display part 120, a drive circuit part 130, and a terminal part 140. The display part 120, the drive circuit part 130, and the terminal part 140 are provided on a substrate 110.

The display part 120 has a plurality of pixels 200R, 200G and 200B. The pixel 200R corresponds to a pixel that emits in red. The pixel 200G corresponds to a pixel that emits in green. The pixel 200B corresponds to a pixel that emits in blue. The display part 120 displays images by controlling the emission and non-emission of the plurality of pixels 200R, 200G and 200B. In the present embodiment, when it is not necessary to distinguish RGB colors in particular, it may be simply described as the pixel 200. The configuration of each pixel 200 will be described later.

The drive circuit part 130 controls each pixel 200 of the display part 120. The drive circuit part 130 includes, for example, a gate line drive circuit. Although it is omitted in FIG. 1, the drive circuit part 130 may include a data line drive circuit.

The terminal part 140 functions as a terminal for receiving a signal supplied to the display part 120 and the drive circuit part 130 from the outside. The terminal part 140 includes a plurality of terminals 141. A flexible printed circuit board 150 is connected to the terminal part 140, each of the plurality of terminals 141 is connected to the corresponding terminals of the flexible printed circuit board 150 side. In the present embodiment, a driver IC chip 160 is provided on the flexible printed circuit board 150. However, the present invention is not limited to this example, and the driver IC chip 160 may be omitted.

FIG. 1 shows the overall configuration of the display device 100 in a plan view, although the substrate 110 may be bent between the display part 120 and the terminal part 140. In this case, a flexible substrate such as a resin substrate may be used as the substrate 110. With such a configuration, it is possible to fold the terminal part 140 and the flexible printed circuit board 150 on the back side of the display device 100, and the display device 100 can be miniaturized.

[Configuration of Pixel Circuit 300]

Figure 2:
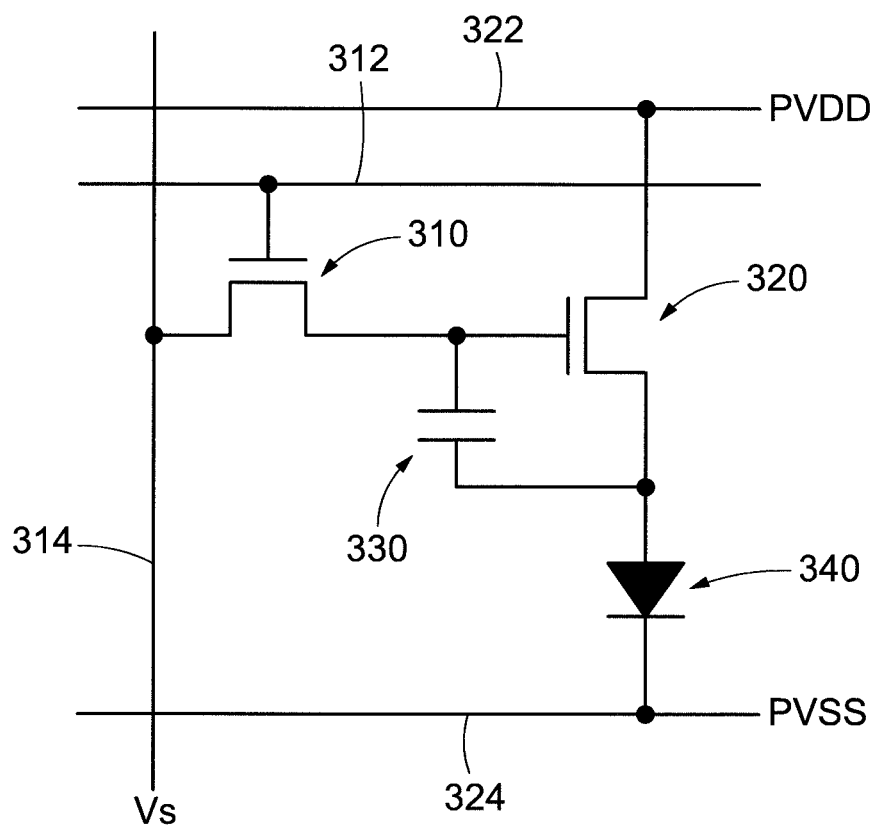
FIG. 2 is a circuit diagram of a circuit configuration of the display device according to the first embodiment of the present invention.

FIG. 2 is a circuit diagram showing a circuit configuration of a pixel 200 in the display device 100 of the first embodiment of the present invention. A pixel circuit 300 includes a selection transistor 310, a drive transistor 320, a capacitor 330, and a light emitting element 340.

The selection transistor 310 is connected to a gate line 312 and a data line 314. Specifically, the gate line 312 is connected to a gate of the selection transistor 310. The data line 314 is connected to a source of the selection transistor 310. The selection transistor 310 functions as a switch for selecting whether to input a data signal (video signal Vs) to the pixel circuit 300. A drain of the selection transistor 310 is connected to the drive transistor 320 and a gate of the capacitor 330.

The drive transistor 320 is connected to an anode power supply line 322, the light emitting element 340, and the capacitor 330. Specifically, the anode power supply line 322 is connected to a drain of the drive transistor 320. The light emitting element 340 is connected to a source of the drive transistor 320. The capacitor 330 is connected between the gate and source of the drive transistor 320. The drive transistor 320 functions as a valve for controlling the amount of current flowing through the light emitting element 340. A high-potential power supply voltage (PVDD) is applied to the anode power supply line 322.

The capacitor 330 serves to hold a data signal input via the selection transistor 310. A voltage corresponding to the data signal held in the capacitor 330 is applied to the gate of the drive transistor 320. Thus, the amount of current flowing through the drive transistor 320 is controlled in accordance with the data signal.

The light emitting element 340 is connected between the drive transistor 320 and a cathode power supply line 324. Specifically, an anode of the light emitting element 340 is connected to the source of the drive transistor 320. That is, the anode of the light emitting element 340 is connected to the anode power supply line 322 via the drive transistor 320. A cathode of the light emitting element 340 is connected to the cathode power line 324. A low-potential power supply voltage (PVSS) is applied to the cathode power supply line 324.

In the pixel circuit 300, a data signal is input from the data line 314 when the selection transistor 310 is turned on. A voltage corresponding to the input data signal is held by the capacitor 330. Thereafter, during the light emission period, the gate of the drive transistor 320 is controlled by the voltage held in the capacitor 330, and a current corresponding to the data signal flows through the drive transistor 320. When a current flows through the light emitting element 340, the light emitting element 340 emits light with a luminance corresponding to the amount of current.

[Configuration of Pixel 200]

Figure 3:
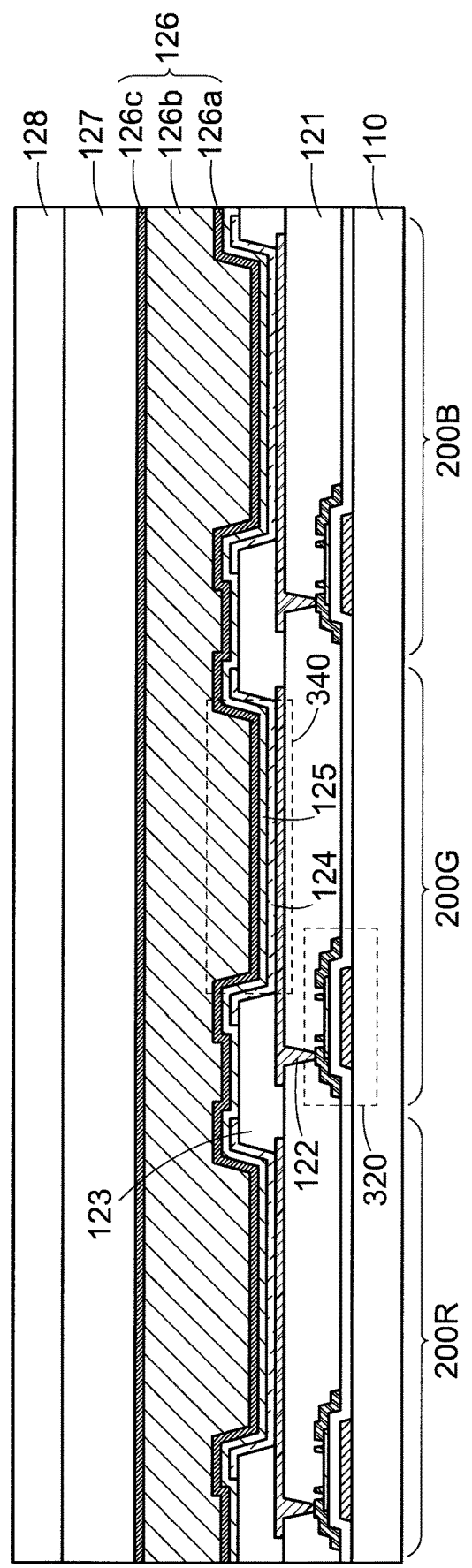
FIG. 3 is a cross-sectional view of a configuration of a display part of the display device according to the first embodiment of the present invention.

FIG. 3 is a cross-sectional view showing the configuration of the display part 120 in the display device 100 according to the first embodiment of the present invention. Specifically, the cross-sectional structure shown in FIG. 3 corresponds to a cross-sectional view of the display part 120 shown in FIG. 1 taken along the dashed-dotted line A-A. Since the basic construction of each pixel 200R, 200G and 200B is the same, FIG. 3 will focus on the pixel 200G that emits in green.

As shown in FIG. 3, the drive transistor 320 is provided on the substrate 110. Although it is omitted in FIG. 3, each element constituting the pixel circuit 300 such as the selection transistor 310 and the capacitor 330 is also provided on the substrate 110.

The drive transistor 320 is covered with an insulating layer 121 including a resin layer. A resin layer included in the insulating layer 121 has a role of planarizing the relief caused by the drive transistor 320 or the like. The insulating layer 121 may have a stacked structure of an inorganic insulating layer and the resin layer. For example, a silicon-based inorganic material such as silicon oxide or silicon nitride can be used as a material of the inorganic insulating layer. For example, a photosensitive organic material such as acrylic or polyimide can be used as a material of the resin layer.

The anode electrode 122 is provided on the insulating layer 121. The anode electrode 122 is an anode of the light emitting element 340 and also functions as a pixel electrode of the pixel 200. The anode electrode 122 is electrically connected to a source electrode of the drive transistor 320 via a contact hole provided in the insulating layer 121. In the present embodiment, the anode electrode 122 is made of a transparent conductive layer. However, not limited to this example, the anode electrode 122 may be constituted by a metal layer or may have a stacked structure of the transparent conductive layer and the metal layer. For example, a transparent conductive layer containing a metal oxide can be used as the anode electrode 122. In the present embodiment, a conductive layer formed by stacking a metal layer containing silver and a transparent conductive layer composed of ITO (Indium Tin Oxide) is used as the anode electrode 122. In this case, the conductive layer on the side in contact with an organic layer 124, which will be described later, is the transparent conductive layer.

A partition layer 123 is provided on the anode electrode 122. The partition layer 123 has an opening so that a portion of the surface of the anode electrode 122 is exposed. That is, the partition layer 123 is provided so as to cover an end of the anode electrode 122. An inner wall of the opening of the partition layer 123 is preferably a gentle tapered shape. By forming the inner wall of the opening of the partition layer 123 in a tapered shape, poor coverage of the organic layer 124 or a cathode electrode 125 formed on the anode electrode 122 can be reduced. The partition layer 123 may be referred to as a bank or a rib.

The organic layer 124 including at least a hole transport layer, a light emitting layer, and an electron transport layer is provided over the anode electrode 122. In the case of the pixel 200G, a light emitting layer of the organic layer 124 is formed of organic materials that emit green light. Similarly, in the case of the pixel 200R and the pixel 200B, the light emitting layer of the organic layer 124 is composed of an organic material that emits in red and an organic material that emits in blue, respectively. The hole transport layer and the electron transport layer included in the organic layer 124 may be provided so as to extend over each pixel 200. The organic layer 124 may further include functional layers such as an electron injection layer, an electron blocking layer, a hole injection layer, or a hole blocking layer.

The cathode electrode 125 is provided on the organic layer 124. The cathode electrode 125 may be provided so as to extend each pixel 200. In the present embodiment, the cathode electrode 125 is formed of a metal layer. However, the present invention is not limited to this example, and the cathode electrode 125 may be composed of a transparent conductive layer or may have a stacked structure of a transparent conductive layer and a metal layer. For example, a metal layer containing an alkali metal or an alkaline earth metal can be used as the cathode electrode 125. In the present embodiment, a metal layer made of an MgAg alloy (alloy containing magnesium and silver) is used as the cathode electrode 125. In this case, the thickness of the cathode electrode 125 is such that visible light can be transmitted therethrough.

A sealing layer 126 is provided on the cathode electrode 125. The sealing layer 126 has, for example, a structure in which an inorganic insulating layer 126a, an organic insulating layer 126b, and an inorganic insulating layer 126c are stacked. As a material of the inorganic insulating layer 126a and the inorganic insulating layer 126c, for example, a silicon-based inorganic material such as silicon oxide or silicon nitride can be used. The inorganic insulating layer 126a and the inorganic insulating layer 126c have a function of preventing entry of moisture from the outside. Therefore, as the inorganic insulating layer 126a and the inorganic insulating layer 126c, an insulating layer having a dense film quality is preferably used. For example, a resin material such as an acrylic resin, an epoxy resin, a polyimide resin, a silicon resin, a fluororesin, or a siloxane resin can be used as the material of the organic insulating layer 126b.

In the present embodiment, a cover glass 128 is provided on the sealing layer 126 via an adhesive layer 127. Although it is omitted in FIG. 3, an optical member such as a polarizing plate or a touch sensor may be further provided above or below the cover glass 128. The adhesive layer 127 and the cover glass 128 may be omitted.

[Configuration of Thin-Film Transistor 10]

Figure 4A:
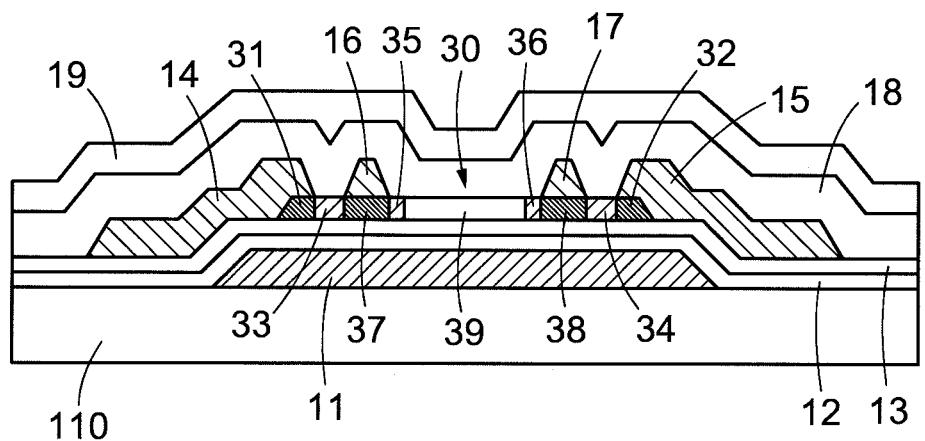
FIG. 4A is a cross-sectional view of a thin-film transistor used in the display device according to the first embodiment of the present invention.
Figure 4B:
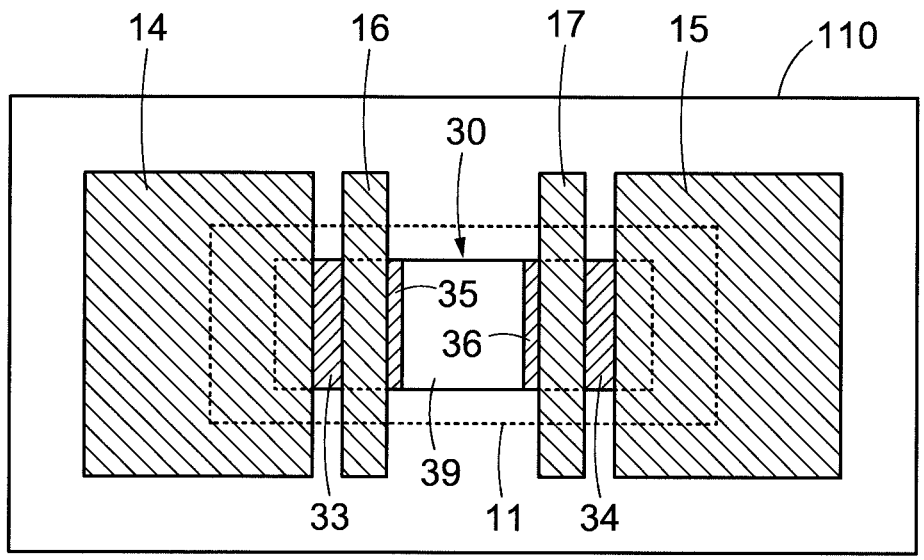
FIG. 4B is a plan view of the thin-film transistor used in the display device according to the first embodiment of the present invention.

FIG. 4A is a cross-sectional view showing a configuration of a thin-film transistor 10 used in the display device 100 according to the first embodiment. FIG. 4B is a plan view showing a configuration of the thin-film transistor 10 used in the display device 100 according to the first embodiment of the present invention. In FIG. 4B, insulating layers 18 and 19 shown in FIG. 4A are omitted for convenience of explanation. The thin-film transistor 10 may be used for at least one of the selection transistor 310 and the drive transistor 320 shown in FIG. 2. The thin-film transistor 10 shown in FIG. 4A and FIG. 4B is an example of a bottom-gate transistor.

A gate electrode 11 is provided on the substrate 110 having an insulating surface. For example, a light-transmitting substrate made of glass, quartz, sapphire, or the like can be used as the substrate 110. However, a non-light-transmitting substrate made of silicon, ceramics, or the like may be used as the substrate 110. Further, a flexible substrate made of a resin material such as a polyimide resin, an acrylic resin, a siloxane resin or a fluororesin may be used as the substrate 110.

The gate electrode 11 is made of, for example, a metal material such as titanium, tantalum, tungsten, molybdenum, vanadium, aluminum, copper, or niobium, or an alloy material containing any of these metals. The gate electrode 11 may have a single layer structure or a stacked structure.

The gate electrode 11 is covered with the insulating layers 12 and 13. In the present embodiment, the insulating layer 12 is a silicon nitride layer. The insulating layer 13 is a silicon oxide layer. In the present embodiment, the insulating layers 12 and 13 are stacked to function as a gate insulating layer. However, not limited to this example, the insulating layer 13 may be used as a single layer as the gate insulating layer.

An oxide semiconductor layer 30 is provided above the insulating layer 13. For example, indium gallium zinc oxide (IGZO), indium tin oxide (ITZO), indium aluminum zinc oxide (IAZO), or Zinc Oxide (ZnO) and the like can be used as a material of the oxide semiconductor layer 30. The oxide semiconductor layer 30 may be a single layer or a stacked layer. In the present embodiment, indium gallium zinc oxide (IGZO) is used as the oxide semiconductor layer 30. Therefore, the thin-film transistor 10 of the present embodiment operates as an N-channel transistor having a majority carrier as an electronic. Details of a structure of the oxide semiconductor layer 30 will be described later.

On the oxide semiconductor layer 30, a source electrode 14 and a drain electrode 15 are provided so as to contact the end of the oxide semiconductor layer 30. Specifically, in cross-sectional view, the source electrode 14 is provided so as to contact a first end portion of the oxide semiconductor layer 30, and the drain electrode 15 is provided so as to contact a second end portion on the opposite side of the first end portion. In the present embodiment, the source electrode 14 and the drain electrode 15 are provided so as to cover three sides at the end portion of the oxide semiconductor layer 30, but the present invention is not limited to this example. For example, the source electrode 14 and the drain electrode 15 may be provided so as to cross the oxide semiconductor layer 30, (that is, so as to cover two sides).

The source electrode 14 and the drain electrode 15 are made of a metal material such as titanium, aluminum, tantalum, tungsten, molybdenum, vanadium, aluminum, copper, or niobium, or an alloy material containing any of these metals. The source electrode 14 and the drain electrode 15 may have a single layer structure or a stacked structure. In the present embodiment, a metal layer having a three-layer structure of titanium/aluminum/titanium is used as the source electrode 14 and the drain electrode 15.

In the present embodiment, metal layers 16 and 17 are formed simultaneously with the source electrode 14 and the drain electrode 15. That is, the metal layers 16 and 17 are both provided in the same layer as the source electrode 14 and the drain electrode 15. Therefore, the metal layers 16 and 17 have a three-layer structure of titanium/aluminum/titanium, similarly to the source electrode 14 and the drain electrode 15. However, the present invention is not limited to this example, and the metal layers 16 and 17 may be formed of a metal material different from the source electrode 14 and the drain electrode 15.

The metal layers 16 and 17 are provided so as to contact the oxide semiconductor layer 30. At this time, the metal layers 16 and 17 are disposed apart from the source electrode 14 and the drain electrode 15, respectively. Specifically, in the present embodiment, a distance between the source electrode 14 and the metal layer 16 is 1.0 μm or more and 3.0 μm or less (preferably 1.5 μm or more and 2.0 μm or less). A distance between the drain electrode 15 and the metal layer 17 is also 1.0 μm or more and 3.0 μm or less (preferably 1.5 μm or more and 2.0 μm or less).

In the present embodiment, the metal layers 16 and 17 are electrically floating. That is, the potentials of the metal layers 16 and 17 are not fixed. However, the present invention is not limited to this example, and the metal layers 16 and 17 may be fixed to a fixed potential. A width of the metal layers 16 and 17 is not particularly limited. In the present embodiment, the width of the metal layers 16 and 17 is 1.0 μm or more and 3.0 μm or less. However, a lower limit of the width of the metal layers 16 and 17 may be the minimum width that can be exposed.

As shown in FIG. 4A, the insulating layers 18 and 19 are provided on the source electrode 14, the drain electrode 15 and the metal layer 16 and 17. The insulating layers 18 and 19 function as passivation layers, respectively. In the present embodiment, a silicon oxide layer is used as the insulating layer 18. Further, a silicon nitride layer is used as the insulating layer 19. In addition to serving as a passivation layer, the insulating layer 18 serves to supply oxygen to the oxide semiconductor layer 30. Therefore, as the material of the insulating layer 18, it is preferable to use a material having a relatively large oxygen content, such as silicon oxide or silicon oxynitride. In contrast, the insulating layer 19 mainly serves as a passivation layer. Therefore, as the insulating layer 19, it is preferable to use a silicon nitride layer having a dense film quality.

[Configuration of Oxide Semiconductor Layer 30]

The thin-film transistor 10 of the present embodiment has the oxide semiconductor layer 30 having a plurality of regions having different electrical resistances to each other (in other words, a plurality of regions having different electrical conductivity). Specifically, the oxide semiconductor layer 30 has a source region 31, a drain region 32, first low resistance regions 33 to 36, second low resistance regions 37 and 38, and a channel region 39.

Each of the first low resistance regions 33 to 36 and the second low resistance regions 37 and 38 has lower electrical resistance than the channel region 39. The second low resistance regions 37 and 38 have even lower electrical resistances than the first low resistance regions 33 to 36. Electrical resistance of the second low resistance region 37 and 38 is substantially equal to the electrical resistance of the source region 31 and the drain region 32. In the present embodiment, the first low resistance regions 33 to 36 function as a buffer region to mitigate electric field concentration in a vicinity of the source region 31 or the drain region 32. Such a buffer region is effective as a hot carrier countermeasure.

Since the oxide semiconductor layer 30 of the present embodiment is indium gallium zinc oxide (IGZO), it has a physical property that when oxygen is desorbed from the inside of the layer to the outside, the electric resistance of the desorbed portion is reduced. Therefore, when another metal layer comes into contact with the oxide semiconductor layer 30, a phenomenon occurs in which oxygen is desorbed from the inside of the oxide semiconductor layer 30 along with oxidation of the other metal layer. That is, the oxide semiconductor layer 30 of this embodiment has a physical property that the electric resistance of the portion in contact with another metal layer and a vicinity thereof is lowered. Therefore, in the oxide semiconductor layer 30 of the present embodiment, due to the influence of the source electrode 14, the drain electrode 15, the metal layer 16, the metal layer 17, and the like, a region having a lower electric resistance than the channel region 39 is formed.

Specifically, as shown in FIG. 4A, the source region 31 and the drain region 32 is formed in a region in contact with the source electrode 14 and the drain electrode 15 of the oxide semiconductor layer 30, respectively. The second low resistance regions 37 and 38 are formed in a region in contact with the metal layers 16 and 17 of the oxide semiconductor layer 30.

The first low resistance region 33 is formed between the source region 31 and the second low resistance region 37. At this time, the first low resistance region 33 is formed over the entire region between the source region 31 and the second low resistance region 37. Similarly, the first low resistance region 34 is formed between the drain region 32 and the second low resistance region 38. Again, the first low resistance region 34 is formed over the entire region between the drain region 32 and the second low resistance region 38. The first low resistance region 35 is formed between the second low resistance region 37 and the channel region 39. Similarly, the first low resistance region 36 is formed between the second low resistance region 38 and the channel region 39.

As described above, the source region 31, the drain region 32, the first low resistance regions 33 to 36, and the second low resistance regions 37 and 38 are formed by desorbing oxygen from the inside of the oxide semiconductor layer 30. Therefore, the oxygen concentration in these regions is lower than that in the channel region 39. The first low resistance regions 33 to 36 are not in direct contact with the source electrode 14, the drain electrode 15, the metal layer 16, and the metal layer 17. Therefore, the oxygen concentration of the first low resistance regions 33 to 36 is higher than that of the source region 31, the drain region 32, and the second low resistance regions 37 and 38, and lower than that of the channel region 39.

The length of the first low resistance regions 33 to 36 (a length along the direction in which a carrier moves) varies depending on the conditions of the manufacturing process after forming the source electrode 14, the drain electrode 15, the metal layer 16 and 17. For example, the length of the first low resistance regions 33 to 36 can be controlled by a process temperature at which the insulating layer 18 is formed, or a bake temperature after the insulating layer 18 is formed. In the present embodiment, for example, the process temperature at the time of forming the insulating layer 18 is controlled so that the first low resistance regions 35 and 36 are 0.5 μm or more and 1.5 μm or less, respectively. However, the present invention is not limited to this example, and the control method is not limited as long as the length of the first low resistance regions 35 and 36 can be finally set to a desired length.

In the first low resistance region 34, oxygen is desorbed by the influence of both the drain electrode 15 and the metal layer 17. Therefore, the formation of the first low resistance region 34 proceeds from both a region close to the drain electrode 15 and a region close to the metal layer 17. Thus, for example, when passing through the above-mentioned process temperature, the length of the first low resistance region 34 is about twice the length of the first low resistance region 36. That is, the length of the first low resistance region 34 is 1.0 μm or more and 3.0 μm or less. As a result, the length of a buffer region in a vicinity of the drain region 32 is substantially the sum of the lengths of the first low resistance regions 34 and 36. That is, according to the present embodiment, a low resistance region having a length of 1.5 μm or more and 4.5 μm or less (preferably 2.0 μm or more and 3.0 μm or less) can be formed as the buffer region in the vicinity of the drain region 32. Here, the description was given focusing on the vicinity of the drain region 32, but the same applies to the vicinity of the source region 31.

According to the findings of the present applicant, in a thin-film transistor using an oxide semiconductor, the longer the length of the low resistance region disposed in a vicinity of the drain region, a hot carrier resistance is improved. Specifically, the present applicant has found that if the length of the low resistance region is at least 1.5 μm or more (preferably 2.0 μm or more), characteristic degradation due to the hot carriers can be effectively suppressed. However, when oxygen is desorbed from the oxide semiconductor layer 30 using only the source electrode 14 and the drain electrode 15, it is difficult to form a low resistance region having a sufficient length.

On the other hand, in the present embodiment, the total length of the low resistance region can be increased only by forming the metal layers 16 and 17 simultaneously with the formation of the source electrode 14 and the drain electrode 15. As described above, according to the present embodiment, the first low resistance regions 33 to 36 having a sufficient length can be formed without increasing the manufacturing process.

Further, there is little variation in the length of the first low resistance regions 33 to 36 in the plane of the substrate 110 since the length of the first low resistance regions 33 to 36 is determined by a thermal history and the like after forming the source electrode 14, the drain electrode 15, the metal layer 16, and the metal layer 17. Therefore, a buffer region of uniform length can be formed for a plurality of thin-film transistors 10.

Further, according to the present embodiment, a buffer region having a sufficient length can be formed in the vicinity of both the source region 31 and the drain region 32. Therefore, for example, as in the selection transistor 310 shown in FIG. 2, in a thin-film transistor in which a source and a drain are switched depending on a magnitude relationship of a voltage applied to the source region and the drain region, it is possible to suppress a characteristic deterioration due to hot carriers, regardless of the moving direction of the carrier. Even when the source and the drain are switched depending on an AC drive or the like, it is possible to suppress the characteristic deterioration, regardless of the moving direction of the carrier.

As described above, according to the present embodiment, it is possible to improve the reliability of the display device 100 including the thin-film transistor 10 using the oxide semiconductor.

<Method of Manufacturing Thin-Film Transistor 10>

FIG. 5A, FIG. 6A, FIG. 7A, FIG. 8A, and FIG. 9A are cross-sectional views showing methods of manufacturing the thin-film transistor 10 used in the display device 100 according to the first embodiment. FIG. 5B, FIG. 6B, FIG. 7B, FIG. 8B and FIG. 9B are plan views showing a manufacturing process of the thin-film transistor 10 used in the display device 100 according to the first embodiment.

Figure 5A:
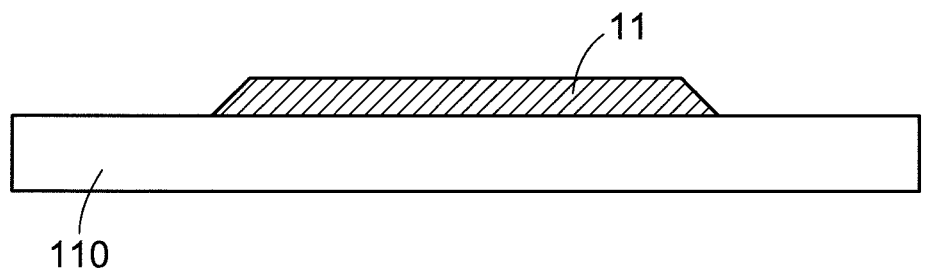
FIG. 5A is a cross-sectional view of a manufacturing process of the thin-film transistor used in the display device according to the first embodiment of the present invention.
Figure 5B:
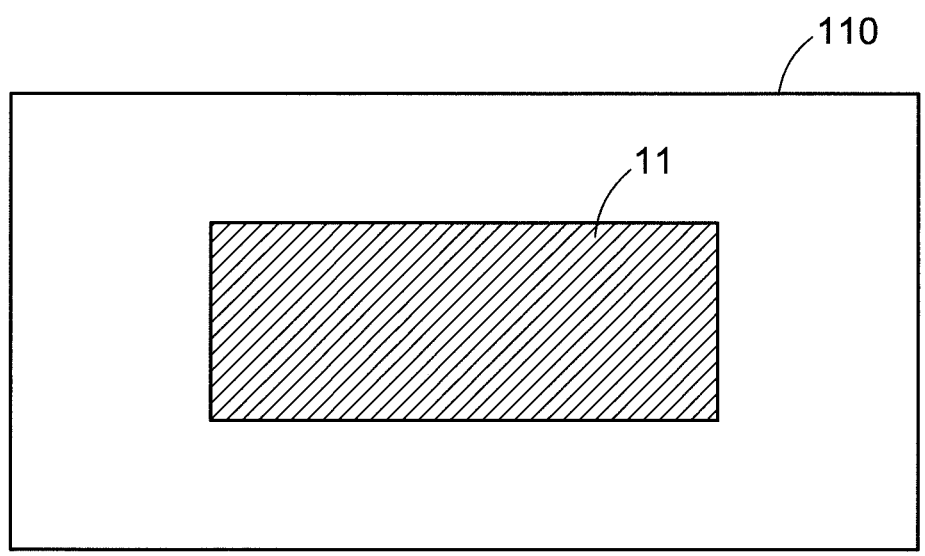
FIG. 5B is a plan view of a manufacturing process of the thin-film transistor used in the display device according to the first embodiment of the present invention.

First, as shown in FIG. 5A and FIG. 5B, the gate electrode 11 is formed on the substrate 110. Specifically, a metal layer containing a metal material forming the gate electrode 11 (which is aluminum and titanium in the present embodiment) is formed. Thereafter, the gate electrode 11 is formed by performing an etching process on the metal layer in which aluminum and titanium are stacked.

Figure 6A:
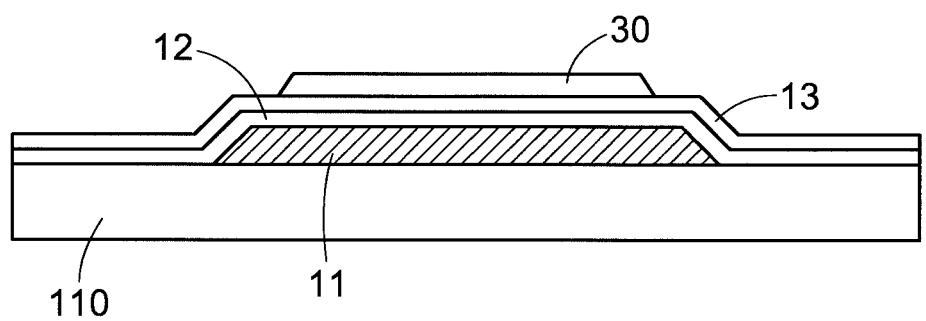
FIG. 6A is a cross-sectional view of a manufacturing process of the thin-film transistor used in the display device according to the first embodiment of the present invention.
Figure 6B:
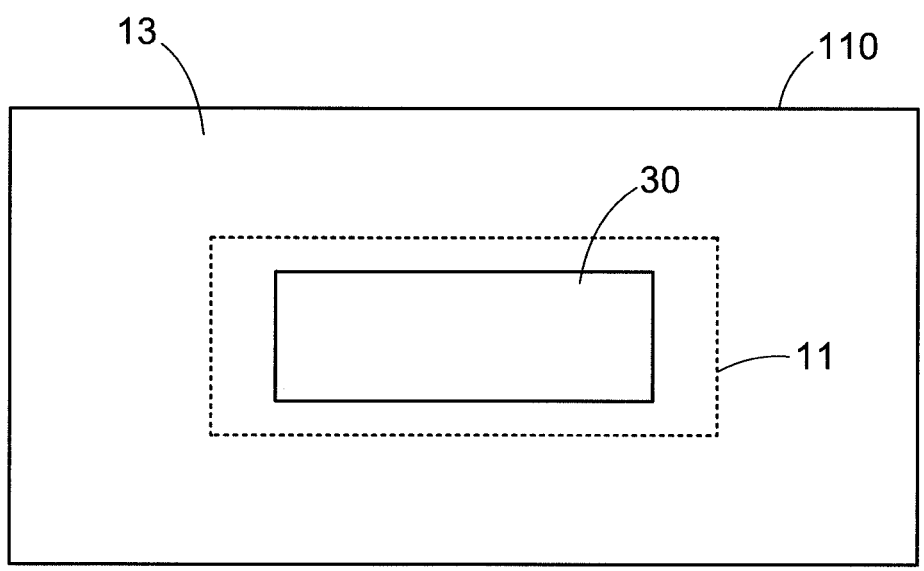
FIG. 6B is a plan view of a manufacturing process of the thin-film transistor used in the display device according to the first embodiment of the present invention.

Next, as shown in FIG. 6A and FIG. 6B, the insulating layers 12 and 13 are formed so as to cover the gate electrode 11. In the present embodiment, first, a silicon nitride layer is formed as the insulating layer 12. Thereafter, a silicon oxide layer is formed on the insulating layer 12 as an insulating layer 13. After forming the insulating layer 13, the oxide semiconductor layer 30 is formed on the insulating layer 13. In the present embodiment, first, the oxide semiconductor layer that consists of indium gallium zinc oxide (IGZO) is formed with a thickness of 40 nm or more and 100 nm or less. Thereafter, the oxide semiconductor layer 30 is formed by performing an etching process on the oxide semiconductor layer.

Figure 7A:
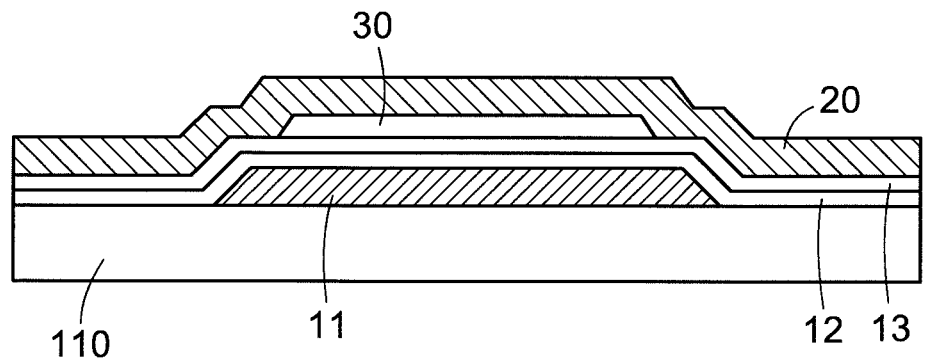
FIG. 7A is a cross-sectional view of a manufacturing process of the thin-film transistor used in the display device according to the first embodiment of the present invention.
Figure 7B:
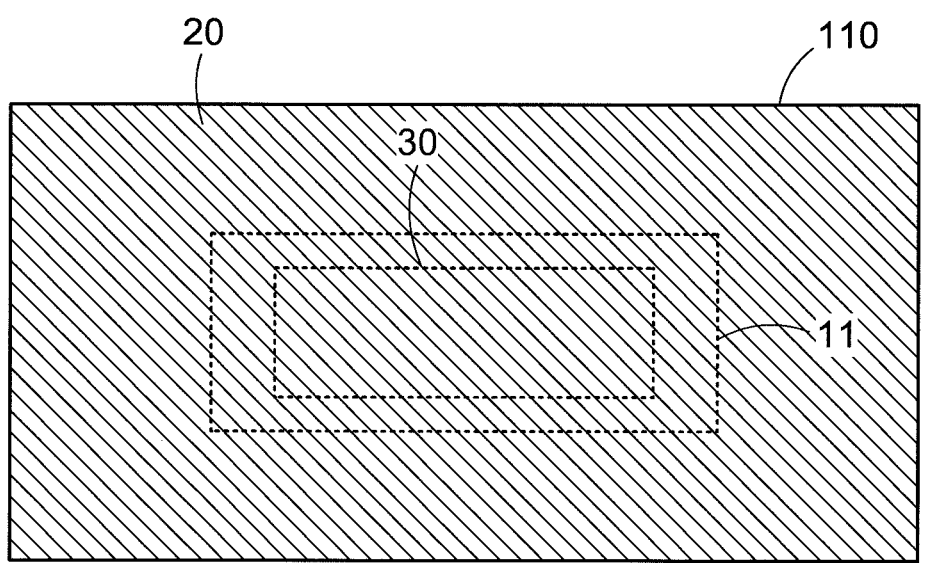
FIG. 7B is a plan view of a manufacturing process of the thin-film transistor used in the display device according to the first embodiment of the present invention.

Next, as shown in FIG. 7A and FIG. 7B, a metal layer 20 is formed so as to cover the oxide semiconductor layer 30. The metal layer 20 is formed by stacking a titanium layer, an aluminum layer, and a titanium layer in this order from the lower layer. In the present embodiment, the oxide semiconductor layer 30 and the aluminum layer are not in direct contact with each other by providing the titanium layer in the bottom layer. Thus, it is possible to prevent excessive oxygen desorption from the oxide semiconductor layer 30 due to oxidation of the aluminum layer.

Figure 8A:
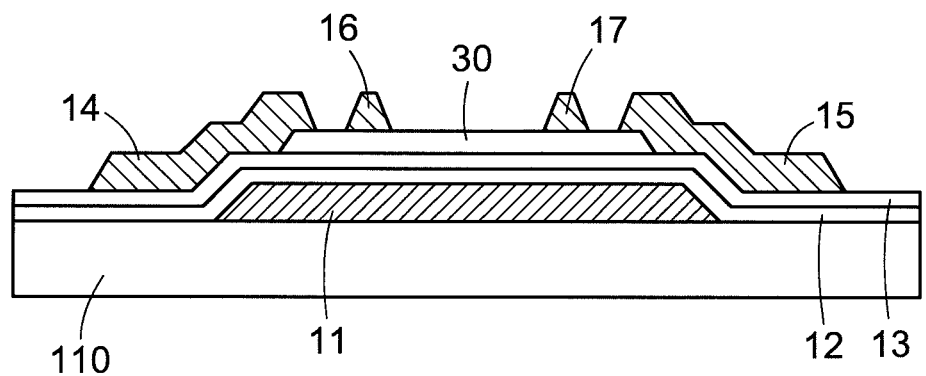
FIG. 8A is a cross-sectional view of a manufacturing process of the thin-film transistor used in the display device according to the first embodiment of the present invention.
Figure 8B:
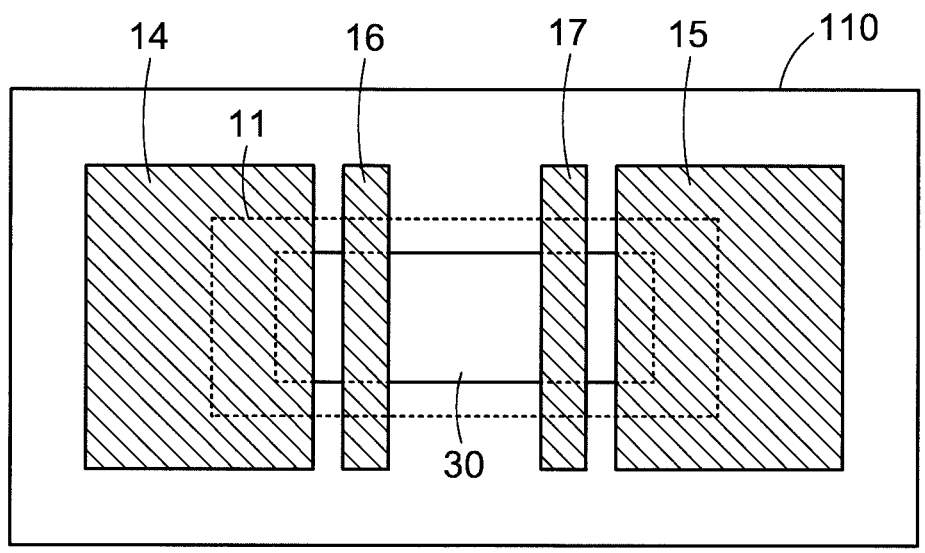
FIG. 8B is a plan view of a manufacturing process of the thin-film transistor used in the display device according to the first embodiment of the present invention.

Next, as shown in FIG. 8A and FIG. 8B, the source electrode 14, the drain electrode 15, the metal layers 16 and 17 are formed by etching the metal layer 20. At this time, as shown in the FIG. 8B, the metal layers 16 and 17 are formed so as to cross the oxide semiconductor layer 30. In the present embodiment, between the source electrode 14 and the metal layer 16 or between the drain electrode 15 and the metal layer 17 are separated from each other by a distance of 1.0 µm or more and 3.0 µm or less (preferably 1.5 µm or more and 2.0 µm or less).

Figure 9A:
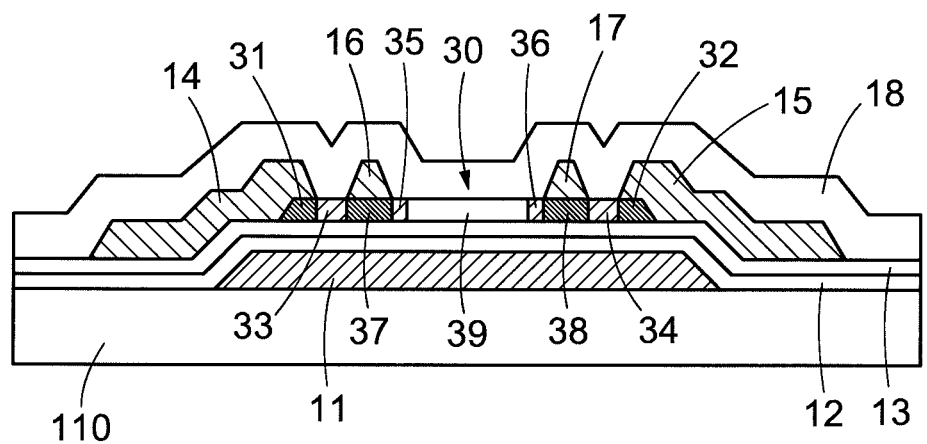
FIG. 9A is a cross-sectional view of a manufacturing process of the thin-film transistor used in the display device according to the first embodiment of the present invention.
Figure 9B:
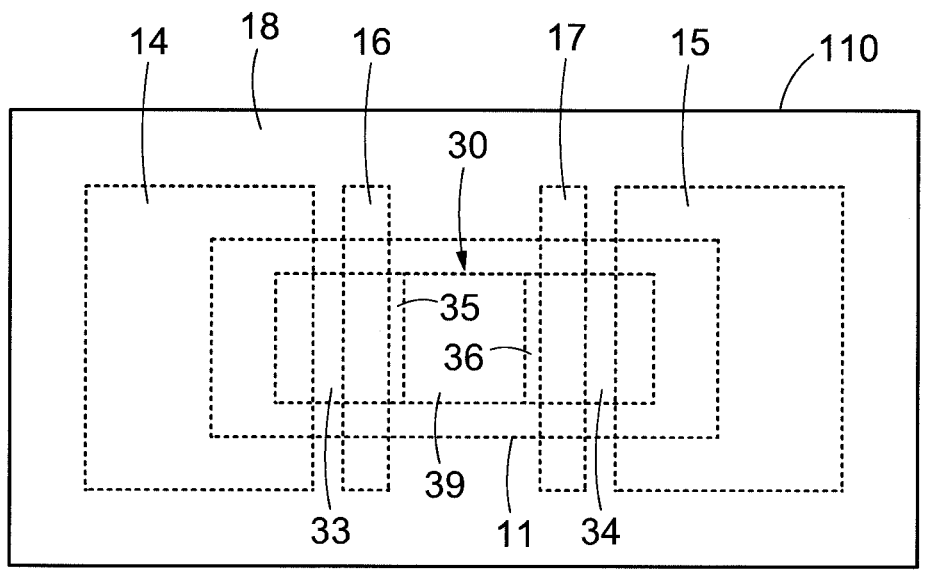
FIG. 9B is a plan view of a manufacturing process of the thin-film transistor used in the display device according to the first embodiment of the present invention.

Next, as shown in FIG. 9A and FIG. 9B, the insulating layer 18 is formed so as to cover the source electrode 14, the drain electrode 15, the metal layer 16, the metal layer 17, and the oxide semiconductor layer 30. In the present embodiment, a silicon oxide layer is formed with a thickness of 100 nm or more and 300 nm or less as the insulating layer 18. In the present embodiment, the source region 31, the drain region 32, the first low resistance regions 33 to 36, the second low resistance region 37 and 38, and the channel region 39 are formed in the oxide semiconductor layer 30 during the formation process of the insulating layer 18. After forming the insulating layer 18, a bake process may be performed on the insulating layer 18. The length of the first low resistance regions 33 to 36 may be adjusted at the temperature of the bake process relative to the insulating layer 18.

In the forming process and the bake process of the insulating layer 18 described above, oxygen is supplied to the channel region 39 from the silicon oxide layer which is the insulating layer 18. Thus, an electric resistance of the channel region 39 can be adjusted so that the channel region 39 functions normally as a channel. The oxygen discharged from the insulating layer 18 is also supplied to the first low resistance regions 33 to 36. However, oxygen is desorbed from the first low resistance regions 33 to 36 by the influence of the metal layers 16 and 17. Thus, an electrical resistance of the first low resistance regions 33 to 36 is lower than that of the channel region 39.

Upon completion of the FIG. 9A and FIG. 9B processing, the insulating layer 19 is formed over the insulating layer 18. In the present embodiment, a silicon nitride layer is formed with a thickness of 100 nm or more and 200 nm or less as the insulating layer 19. Thus, the thin-film transistor 10 having the construction described with reference to FIG. 4A and FIG. 4B is completed.

Second Embodiment

In the present embodiment, a display device provided with a thin-film transistor 10a having a structure that is different from the first embodiment will be described. In the present embodiment, portions different from those of the first embodiment will be mainly described. In the drawings used in the description of the present embodiment, the same components as those of the first embodiment are denoted by the same reference numerals, and detailed description thereof is omitted.

Figure 10A:
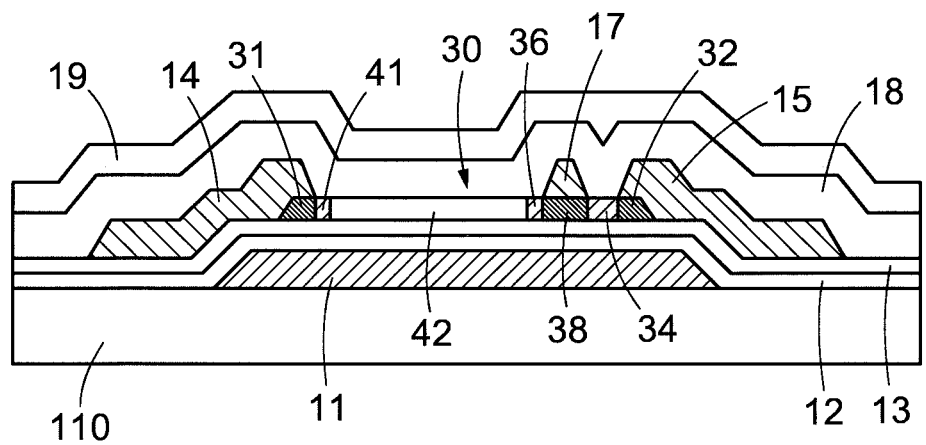
FIG. 10A is a cross-sectional view of a thin-film transistor used in a display device according to a second embodiment of the present invention.
Figure 10B:
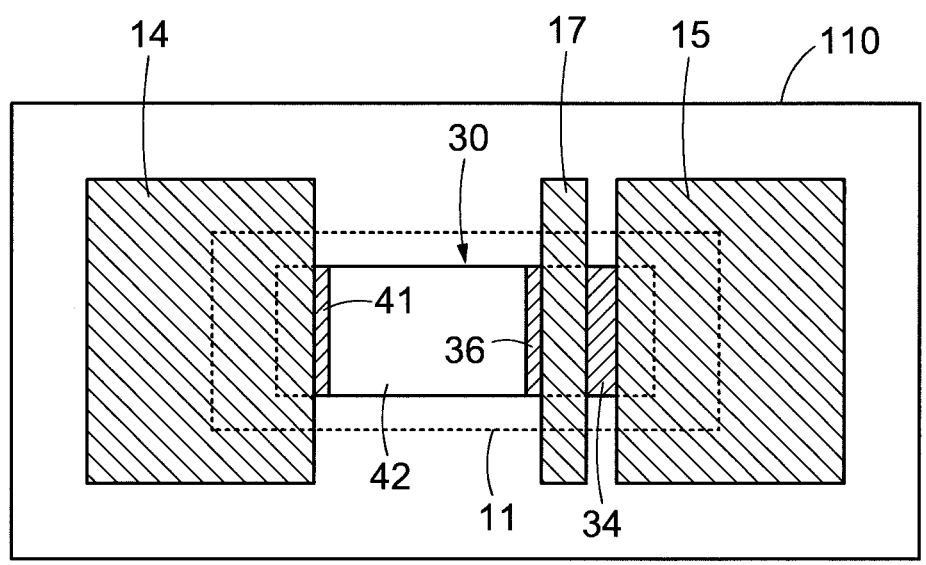
FIG. 10B is a plan view of the thin-film transistor used in the display device according to the second embodiment of the present invention.

FIG. 10A is a cross-sectional view showing a configuration of the thin-film transistor 10a used in the display device of the second embodiment of the present invention. FIG. 10B is a plan view showing the configuration of the thin-film transistor 10a used in the display device of the second embodiment of the present invention. As shown in FIG. 10A and FIG. 10B, in the present embodiment, the metal layer 16 shown in FIG. 4A and FIG. 4B is not provided in a vicinity of the source electrode 14.

In the case of a thin-film transistor in which the positional relationship between the source and the drain does not change and the carriers always move in a constant direction, it is sufficient that a buffer region having a sufficient length is provided only in a vicinity of the drain region. Corresponding to such a case, in the present embodiment, the first low resistance regions 34 and 36 are provided only in the vicinity of the drain region 32. In this case, only a first low resistance region 41 formed by oxidation of the source electrode 14 is formed in the vicinity of the source region 31. Therefore, In the present embodiment, between the first low resistance region 41 and the first low resistance region 36 functions as a channel region 42.

Also in the present embodiment, the first low resistance regions 34 and 36 having a sufficient length can be formed in the vicinity of the drain region 32 without increasing the manufacturing process. As in the first embodiment, the length of the first low resistance regions 34 and 36 can be made uniform between a plurality of thin-film transistors 10a. Thus, according to the present embodiment, it is possible to improve a reliability of the display device including the thin-film transistor 10a using an oxide semiconductor.

Third Embodiment

In the present embodiment, a display device having a thin-film transistor 10b having a structure that is different from the first embodiment will be described. Incidentally, the thin-film transistor 10b of the present embodiment corresponds to the structure of the bottom gate type thin-film transistor 10 described in the first embodiment, which is changed to a top gate type thin-film transistor.

Figure 11A:
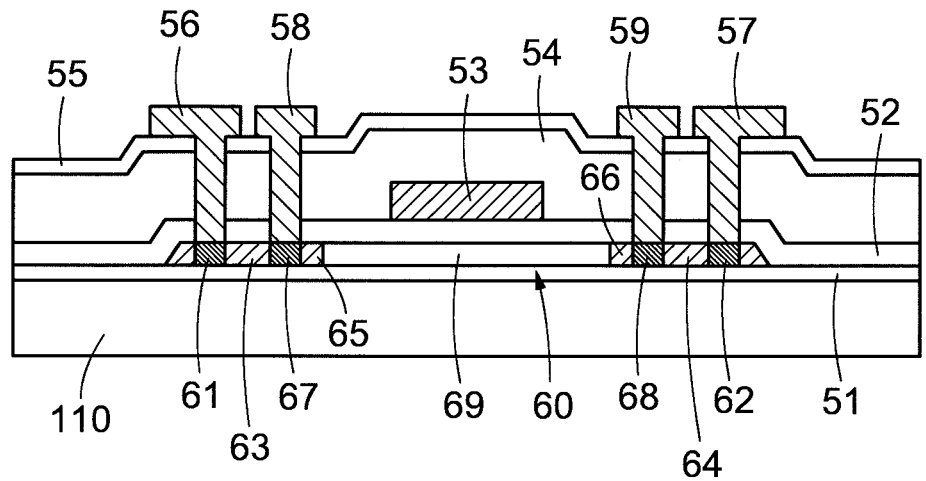
FIG. 11A is a cross-sectional view of a thin-film transistor used in a display device according to a third embodiment of the present invention.
Figure 11B:
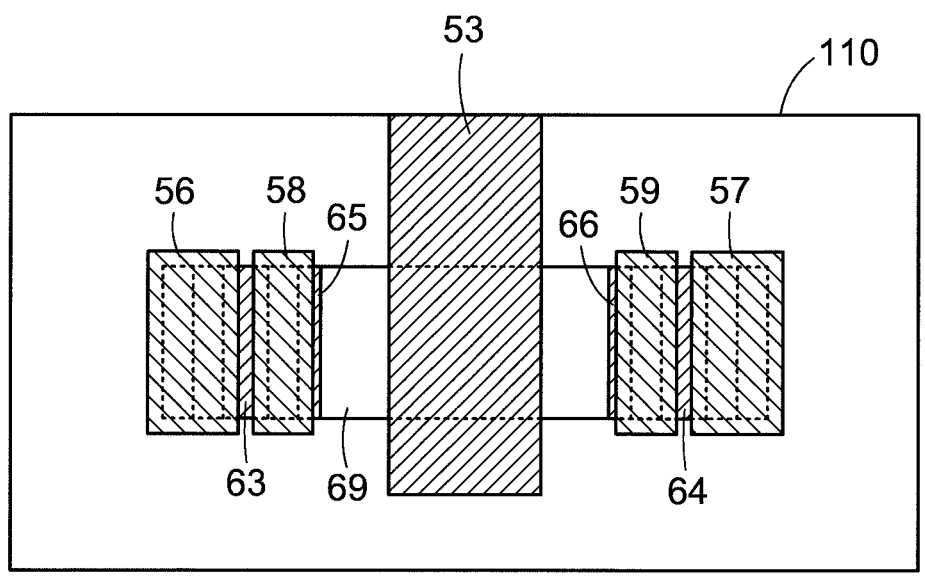
FIG. 11B is a plan view of the thin-film transistor used in the display device according to the third embodiment of the present invention.

FIG. 11A is a cross-sectional view showing a configuration of the thin-film transistor 10b used in a display device according to the third embodiment of the present invention. FIG. 11B is a plan view showing the configuration of the thin-film transistor 10b used in the display device according to the third embodiment of the present invention. In FIG.

11B, for convenience of explanation, drawings of a gate insulating layer 52, an insulating layer 54, and an insulating layer 55 shown in FIG. 11A are omitted. The thin-film transistor 10b may be used for at least one of the selection transistor 310 and the drive transistor 320 shown in FIG. 2. The thin-film transistor 10b shown in FIG. 11A and FIG. 11B is an example of a top-gate transistor.

An oxide semiconductor layer 60 is provided on the substrate 110 via a base layer 51. A silicon oxide layer or an insulating layer having a two-layer structure of a silicon nitride layer and a silicon oxide layer can be used as the base layer 51. When the base layer 51 has a two-layer structure, the insulating layer in contact with the oxide semiconductor layer 60 is preferably a silicon oxide layer. Since the material of the substrate 110 is the same as that of the first embodiment, the description thereof is omitted.

For example, indium gallium zinc oxide (IGZO), indium tin oxide (ITZO), indium aluminum zinc oxide (IAZO), or zinc oxide (ZnO) can be used as a material of the oxide semiconductor layer 60. The oxide semiconductor layer 60 may be a single layer or a stacked layer. In the present embodiment, indium gallium zinc oxide (IGZO) is used as the oxide semiconductor layer 60. Therefore, the thin-film transistor 10b of the present embodiment operates as the N-channel transistor having a majority carrier as an electronic.

The oxide semiconductor layer 60 is covered with the gate insulating layer 52. In the present embodiment, a silicon oxide layer is used as the gate insulating layer 52. However, the present invention is not limited to this example, and an insulating layer having a two-layer structure of a silicon nitride layer and a silicon oxide layer may be used as the gate insulating layer 52. However, in this case, an insulating layer in contact with the oxide semiconductor layer 60 is preferably a silicon oxide layer.

A gate electrode 53 is provided on the gate insulating layer 52. Since the material of the gate electrode 53 is the same as that of the first embodiment, the description thereof is omitted. The gate electrode 53 is covered with the insulating layers 54 and 55. In the present embodiment, the insulating layer 54 is a silicon oxide layer. The insulating layer 54 is mainly provided for insulating and separating the gate electrode 53, a source electrode 56, a drain electrode 57, a metal layer 58, and a metal layer 59. The insulating layer 55 is a silicon nitride layer. The insulating layer 55 functions as a passivation film. However, the present invention is not limited to this example, and the insulating layer 55 may be omitted.

The source electrode 56, the drain electrode 57, the metal layer 58, and the metal layer 59 are provided on the insulating layer 55. In the present embodiment, as in the first embodiment, a metal layer having a three-layer structure of titanium, aluminum, and titanium is used as the source electrode 56, the drain electrode 57, the metal layer 58, and the metal layer 59. In the present embodiment, the metal layers 58 and 59 may be electrically floating or may be fixed at a constant potential. In the present embodiment, the source electrode 56, the drain electrode 57, the metal layer 58, and the metal layer 59 are simultaneously formed by the same process. That is, the source electrode 56 and the drain electrode 57, and the metal layers 58 and 59 are elements provided in the same layer. However, the present invention is not limited to this example, and the metal layers 58 and 59 may be formed of a metal material that is different from the source electrode 56 and the drain electrode 57.

Each of the source electrode 56, the drain electrode 57, and the metal layers 58 and 59 is in contact with the oxide semiconductor layer 60 through a contact hole provided in the gate insulating layer 52, the insulating layers 54 and 55. Therefore, as in the first embodiment, oxygen is desorbed from the oxide semiconductor layer 60 with the oxidation of the source electrode 56, the drain electrode 57, the metal layer 58, and the metal layer 59. As a result, a source region 61, a drain region 62, first low resistance regions 63 to 66, second low resistance regions 67 and 68, and a channel region 69 is formed on the oxide semiconductor layer 60. Since the details of the source region 61, the drain region 62, the first low resistance regions 63 to 66, and the second low resistance regions 67 and 68 are respectively same as the descriptions of the source region 31 and the drain region 32 in the first embodiment, the description here will be omitted.

The metal layers 58 and 59 are disposed apart from the source electrode 56 and the drain electrode 57, respectively. Specifically, in the present embodiment, the length of the first low resistance region 63 or the length of the first low resistance region 64 is designed to be 1.0 μm or more and 3.0 μm or less, preferably 1.5 μm or more and 2.0 μm or less. Therefore, the length of the buffer region in a vicinity of the source region 61 or the drain region 62 (the total length of the first low resistance regions 63 and 65 or the total length of the first low resistance regions 64 and 66) is 1.5 μm or more and 4.5 μm or less (preferably 2.0 μm or more and 3.0 μm or less).

As described above, according to the present embodiment, it is possible to form the first low resistance regions 63 to 66 having a sufficient length without increasing the manufacturing process. Further, there is little variation in the length in the plane of the substrate 110, since the length of the first low resistance regions 63 to 66 is determined by a thermal history after forming the source electrode 56, the drain electrode 57, the metal layer 58, and the metal layer 59 or the like. Therefore, a buffer region of uniform length can be formed with respect to a plurality of thin-film transistors 10b. Thus, according to the present embodiment, it is possible to improve a reliability of the display device including the thin-film transistor 10b using an oxide semiconductor.

Fourth Embodiment

In the present embodiment, a display device provided with a thin-film transistor 10c having a structure that is different from the third embodiment will be described. In the present embodiment, portions different from those of the first embodiment will be mainly described. In the drawings used in the description of the present embodiment, the same components as those of the first embodiment are denoted by the same reference numerals, and detailed description thereof is omitted.

Figure 12A:
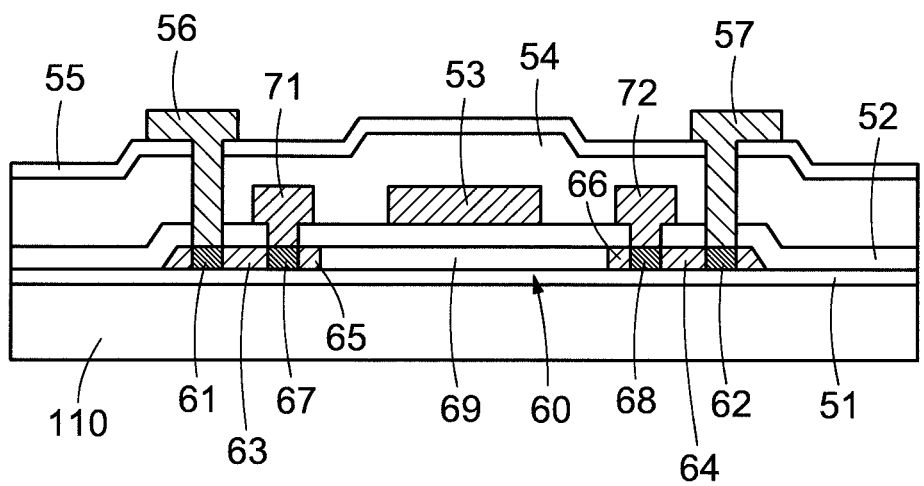
FIG. 12A is a cross-sectional view of a thin-film transistor used in a display device according to a fourth embodiment of the present invention.
Figure 12B:
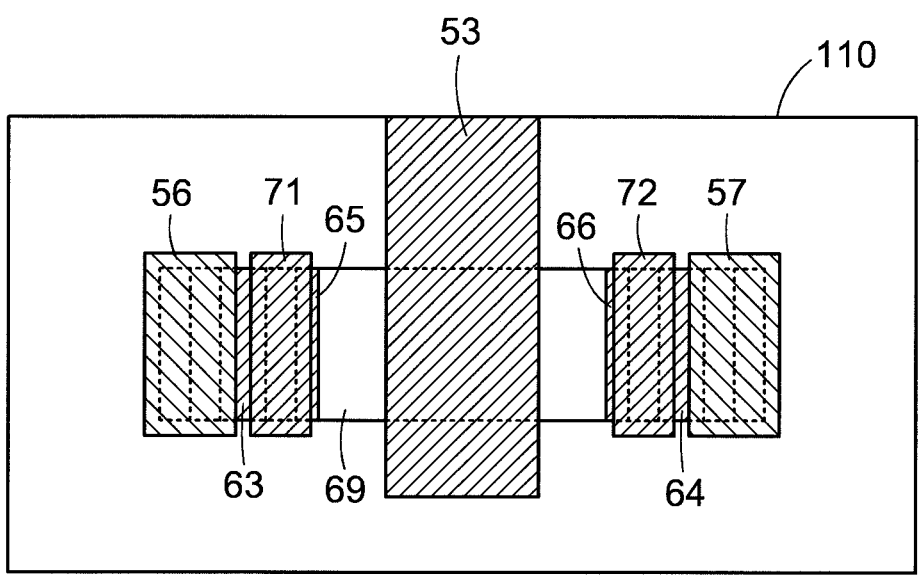
FIG. 12B is a plan view of the thin-film transistor used in the display device according to the fourth embodiment of the present invention.

FIG. 12A is a cross-sectional view showing a configuration of the thin-film transistor 10c used in the display device of the fourth embodiment of the present invention. FIG. 12B is a plan view showing the configuration of the thin-film transistor 10c used in the display device of the second embodiment of the present invention. As shown in FIG. 12A and FIG. 12B, in the present embodiment, metal layers of the same layer as the gate electrode 53 are used as metal layers 71 and 72.

In the present embodiment, after forming the gate insulating layer 52, so that the region to be the second low resistance regions 67 and 68 after is exposed, to form a contact hole with respect to the gate insulating layer 52. Thereafter, a metal layer in which aluminum and titanium are stacked is formed, and an etching process is performed to forming the gate electrode 53, the metal layers 71 and 72. That is, in the present embodiment, the gate electrode 53, the metal layers 71 and 72 are simultaneously formed in the same process. That is, the gate electrode 53, the metal layers 71 and 72 are elements provided in the same layer. However, the present invention is not limited to this example, and the metal layers 71 and 72 may be formed of a metal material different from that of the gate electrode 53.

The metal layers 71 and 72 are both in contact with the oxide semiconductor layer 60 via the contact hole provided in the gate insulating layer 52. Therefore, the first low resistance regions 63 to 66 and the second low resistance regions 67 and 68 are formed on the oxide semiconductor layer 60 due to the source electrode 56, the drain electrode 57, the metal layer 71, and the metal layer 72. Since the structure of the oxide semiconductor layer 60 is the same as that of the third embodiment, a description thereof is omitted.

Also in the present embodiment, the first low resistance regions 64 and 66 having a sufficient length can be formed in a vicinity of the drain region 62 without increasing the manufacturing process. As in the third embodiment, the length of the first low resistance regions 64 and 66 can be made uniform with respect to a plurality of thin-film transistors 10c. Thus, according to the present embodiment, it is possible to improve a reliability of the display device including the thin-film transistor 10c using an oxide semiconductor.

In each of the embodiments described above, the display device has been exemplified and described. However, not limited to this example, each embodiment can be applied to the overall device including a device using a semiconductor, i.e., a semiconductor device. In addition, each of the embodiments described above as an embodiment of the present invention can be appropriately combined and implemented as long as they do not contradict each other. Those skilled in the art that add, delete, or change the design of constituent elements, or add, omit, or change the conditions of processes are also included in the scope of the present invention as long as they have the gist of the present invention.

Further, it is understood that other operational effects different from those provided by the aspects of the respective embodiments described above, or those which can be easily predicted by those skilled in the art from the description herein, are naturally brought about by the present invention.

What is claimed is:

1. A semiconductor device including a thin-film transistor, the thin-film transistor comprising:
    an oxide semiconductor layer;
    a gate insulating layer;
    a gate electrode overlapped on the oxide semiconductor layer through the gate insulating layer;
    a source electrode in contact with the oxide semiconductor layer;
    a drain electrode in contact with the oxide semiconductor layer; and
    a first metal layer in contact with the oxide semiconductor layer and disposed between the source electrode and the drain electrode at a distance from the source electrode and the drain electrode, wherein
    the oxide semiconductor layer includes a channel region and a low resistance region, the low resistance region overlaps the first metal layer, and
    an oxygen concentration of the low resistance region is lower than the oxygen concentration of the channel region.

2. The semiconductor device according to claim 1, wherein
    the distance between the first metal layer and the drain electrode is equal to or more than 1.0 μm and equal to or less than 3.0 μm.

3. The semiconductor device according to claim 1, wherein
    the first metal layer and the drain electrode are located in the same layer as each other.

4. The semiconductor device according to claim 1, wherein
    the first metal layer and the drain electrode are formed of the same metal material as each other.

5. The semiconductor device according to claim 1, wherein
    the first metal layer is electrically floating.

6. The semiconductor device according to claim 1, wherein
    the first metal layer penetrates the gate insulating layer and contacts the oxide semiconductor layer.

7. The semiconductor device according to claim 1, further comprising:
    a second metal layer in contact with the oxide semiconductor layer and disposed between the source electrode and the first metal layer at a distance from the source electrode and the first metal layer.

8. The semiconductor device according to claim 7, wherein
    the distance between the second metal layer and the source electrode is equal to or more than 1.0 μm and equal to or less than 3.0 μm.

9. The semiconductor device according to claim 1, wherein
    the oxide semiconductor layer further includes a drain region, and the low resistance region is between the channel region and the drain region.

10. The semiconductor device according to claim 9, wherein
    a first region of the low resistance region is located between a region in contact with the first metal layer and the drain region.

11. The semiconductor device according to claim 10, wherein
    a second region of the low resistance region is located between the region in contact with the first metal layer and the channel region.

12. The semiconductor device according to claim 11, wherein
    the first region and the second region are separated from each other by the region in contact with the first metal layer.

* * * * *